(12) United States Patent
Bankov et al.

(10) Patent No.: US 8,482,472 B2
(45) Date of Patent: Jul. 9, 2013

(54) PLANAR ANTENNA

(75) Inventors: Sergei Evgenjevich Bankov, Moscow (RU); Vadim Anatoljevich Kaloshin, Moscow (RU)

(73) Assignees: Samsung Electronics Co., Ltd (KR); Institute of RadioEngineering and Electronics of the Russian Academy of Sciences (RU)

( * ) Notice: Subject to any disclaimer, the term of this patent is extended or adjusted under 35 U.S.C. 154(b) by 1264 days.

(21) Appl. No.: 10/580,126

(22) PCT Filed: Nov. 15, 2004

(86) PCT No.: PCT/KR2004/002957
§ 371 (c)(1),
(2), (4) Date: Jan. 15, 2009

(87) PCT Pub. No.: WO2005/050785
PCT Pub. Date: Jun. 2, 2005

(65) Prior Publication Data
US 2009/0115675 A1   May 7, 2009

(30) Foreign Application Priority Data
Nov. 21, 2003  (RU) ................................ 2003133969

(51) Int. Cl.
*H01Q 13/10* (2006.01)
(52) U.S. Cl.
USPC ....................................................... 343/771

(58) Field of Classification Search
USPC .......................... 343/767, 770, 771, 772, 776
See application file for complete search history.

(56) References Cited

U.S. PATENT DOCUMENTS

| | | | | |
|---|---|---|---|---|
| 4,755,821 A | * | 7/1988 | Itoh et al. | 343/700 MS |
| 5,412,394 A | | 5/1995 | Milroy | |
| 5,483,248 A | * | 1/1996 | Milroy | 343/785 |
| 6,020,858 A | * | 2/2000 | Sagisaka | 343/771 |
| 2004/0090290 A1 | * | 5/2004 | Teshirogi et al. | 333/237 |

FOREIGN PATENT DOCUMENTS

| | | |
|---|---|---|
| EP | 0 345 454 | 12/1989 |
| EP | 0 536 522 | 4/1993 |
| JP | 01-238305 | 9/1989 |
| JP | 2001-156536 | 6/2001 |
| RU | 2 144 721 | 1/2000 |
| SU | 1256114 | 9/1986 |
| WO | WO03044896 | * 5/2003 |

* cited by examiner

*Primary Examiner* — Robert Karacsony
(74) *Attorney, Agent, or Firm* — The Farrell Law Firm, P.C.

(57) ABSTRACT

The present invention relates to antenna systems. Technical result of the invention is providing operation of two-polarization antenna manufactured on the basis of planar metal-dielectric waveguide in wide range of frequencies. The technical result is achieved by the fact that the antenna comprises a planar metal-plated, at least on one side, dielectric waveguide to the side walls of which two metal waveguides joined with the planar waveguide via periodical array of slots are connected, wherein the array comprises two slots shifted or inclined with respect to each other, and wherein radiating elements having two symmetry planes are placed in nodes of a rhombic mesh on a surface of the planar waveguide.

7 Claims, 9 Drawing Sheets

FEEDING WAVEGUIDE

FIG.3

SPHERICAL SYSTEM OF COORDINATES

FIG.4

ORIENTATION OF THE ELECTRIC
FIELD IN RADIATING ELEMENT

PLANAR ANTENNA

BACKGROUND OF THE INVENTION

1. Field of the Invention

The invention relates to radio engineering, and more particularly, to antenna systems and can be applied in communication systems, radiolocation and satellite TV.

2. Description of the Related Art

Planar antennas have small dimensions and are widely used in different wave bands.

Plane antennas have large losses in centimeter and millimeter band, therefore antennas are used more frequently as arrays of metal waveguides of leaky wave. Such antennas allow to provide low losses and operation in two polarizations [1]. Complex manufacturing technology and high weight refer to disadvantages of such antennas.

Known is an antenna based on planar metal dielectric antenna waveguide with central feeder and normal radiating that provide activity in two polarizations and is free from the said disadvantages [2]. The disadvantage of this antenna is relatively small band pass of operation frequencies not exceeding, as a rule, several percents and conditioned by input mismatch due to resonance reflection. For the similar reason an antenna [3] that has more complex two-layer structure has the similar disadvantage.

The closest prior art is an antenna of leaky wave comprising a planar dielectric waveguide with 2D array of dielectric radiators and two orthogonally located linear exciters, which can provide operation in two polarizations [4]. The disadvantage of this antenna is narrow frequency band because of divergence of directions of wave radiation with orthogonal polarizations due to frequency scanning.

SUMMARY OF THE INVENTION

The object of the claimed invention is creation of two-polarization antenna on the basis of metal dielectric waveguide, which antenna operates in wide frequency band.

The technical result is achieved by the fact that the antenna comprises: a planar metal-plated, at least on one side, dielectric waveguide, to the sides of which two metal waveguides are connected and are joined with the planar waveguide via periodical array of slots, wherein the array comprises two slots shifted or inclined with respect to each other, and radiating elements having two symmetry planes are placed in nodes of a rhombic mesh on the surface of the planar waveguide.

The planar antenna can be characterized by the fact that it has form of a rhomb.

The planar antenna can be characterized by the fact that the metal waveguide has rectangular cross-section.

The planar antenna can be characterized by the fact that metal waveguides are contacting with the planar waveguide by its wide sides.

The planar antenna can be characterized by the fact that metal waveguides are contacting with the planar waveguide by its narrow sides.

BRIEF DESCRIPTION OF THE DRAWINGS

The essence of the invention is explained with references to the drawings in which.

DETAILED DESCRIPTION OF THE PREFERRED EMBODIMENTS

Figure 1:
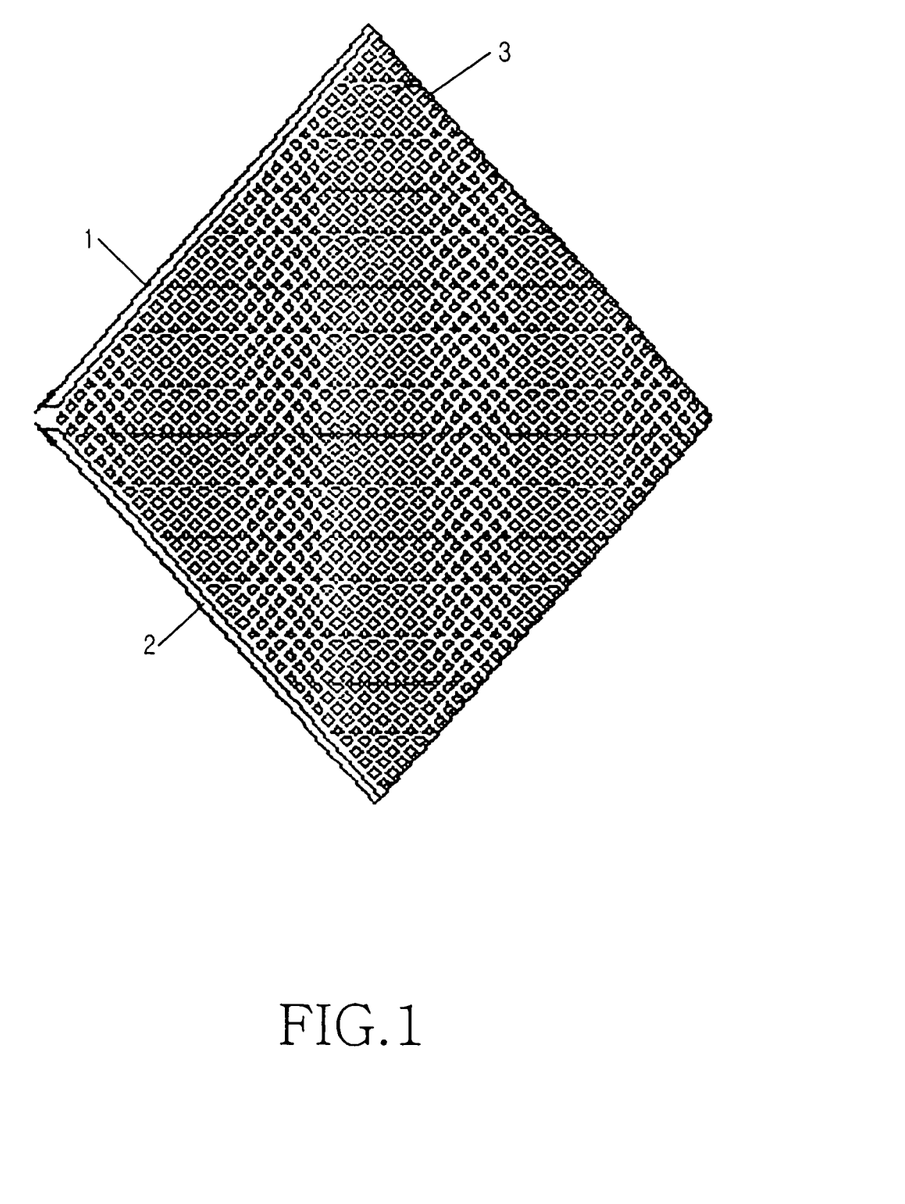
FIG. 1 illustrates general view of the planar antenna according to the Invention.

Overall view of the claimed antenna is presented in FIG. 1. Antenna consists of the following elements:

feeding waveguide 1;

feeding waveguide 2;

plane waveguide formed by a dielectric plate with one or two metal-plated surfaces;

array of radiating elements 3 formed by heterogeneities on the surface of dielectric (metal or dielectric) or on the metal (in the form of corrugation, slots, etc.)

The plane waveguide (PW) has form of a rhomb. It can also have another form.

Figure 2A:
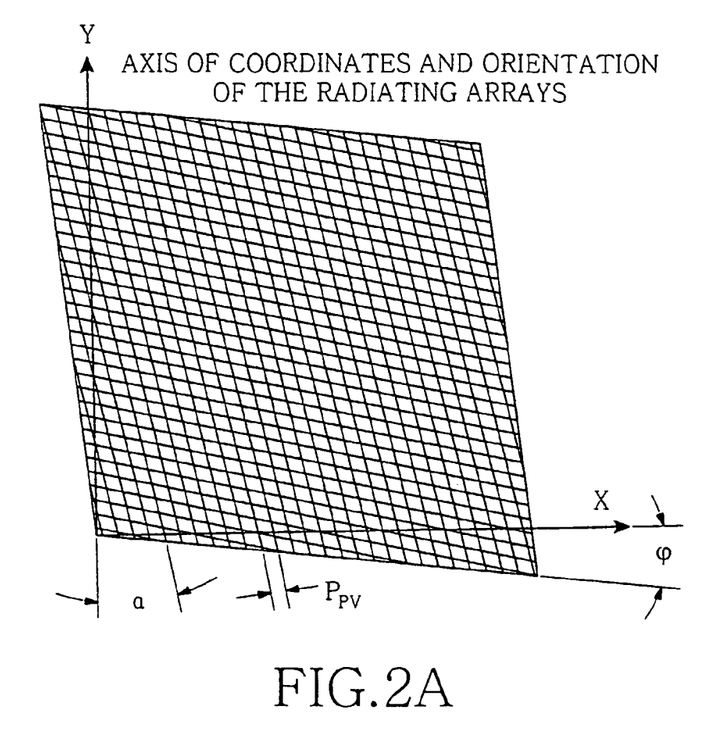
FIG. 2 illustrates a mesh in nodes of which radiating elements are situated.

FIG. 2a illustrates a rhombic mesh in the nodes of which radiating elements are placed. It is seen from the drawing that, in general, angles of inclination of the waveguides relating to orthogonal axes and inclination angles of mesh lines are not equal to zero and are not equal to each other.

Figure 3:
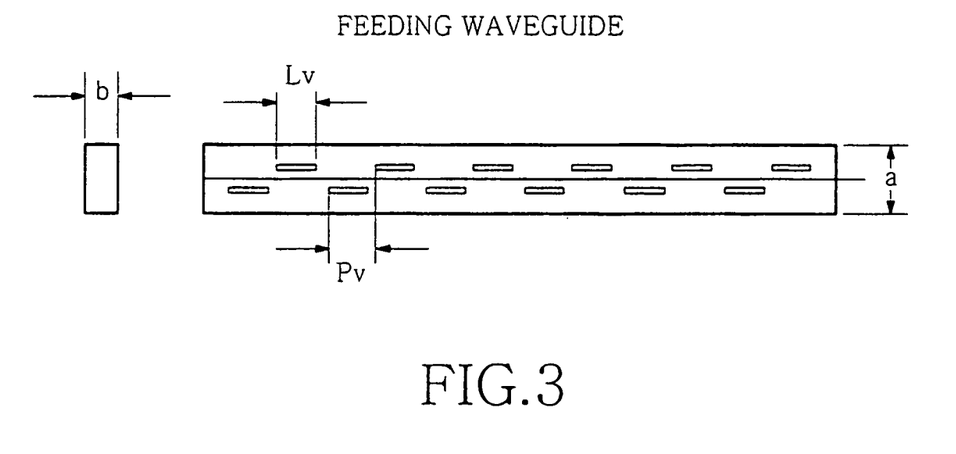
FIG. 3 illustrates feeding waveguide with communication slots.

The waveguides 1 and 2 provide excitement of the plane waveguide and the array on its basis, which array converts 2D wave beam into waves of radiation of free space. Communication of the waveguide with the plane waveguide is provided by means of system of holes and slots presented in wide and narrow side of the waveguide and which are situated in the area of junction of the waveguides 1, 2 with the plane waveguide. A waveguide with linear array of slots is illustrated in FIG. 3.

In general, size of slots and their shifting from the waveguide axis can vary along the waveguide. The waveguide has a flange on one side for connection with external devices and a matched load on the other side.

Lets review the antenna in transmitting mode. The eigenwave of the waveguide going along the array of slots excites them and the slots, in turn, excite the fundamental wave of the PW, which is T-wave with propagation constant $\gamma_{pw}$ equal to $k\sqrt{\varepsilon}$, k—wave number of free space, and $\varepsilon$-relative dielectric permittivity of the PW. If thickness of the plane waveguide is selected in accordance with the following equation:

$$h < \frac{\lambda}{2\sqrt{\varepsilon}} \quad (1)$$

where h—thickness of PW, and λ—wave length in a free space, then there is one propagating wave in the plane waveguide.

Constant of propagation of a rectangular metal waveguide $\gamma_w$ is defined by the following relation:

$$\gamma_w = \sqrt{k^2 - \left(\frac{\pi}{a}\right)^2} \quad (2)$$

where α—size of a wide side of the waveguide. It is known that a linear array can radiate different Floquet space harmonics. Since wave in the waveguide is a fast wave and the plane waveguide is a dielectric-filled waveguide, the plane waveguide can radiate zero harmonics. In order to have proper antenna operation, radiation has to be performed on the minus first harmonic (harmonic with the number "minus 1"). In order to delete radiation of Floquet zero harmonic the slots are located in chequer-wise. Such slots location leads to additional phase shift of slots equal to π that is equivalent to increasing wave retardation of the waveguide on $$\frac{\pi}{kP_w},$$

in which $P_w$ is a distance between slots (see FIG. 3). As the result, by means of selection of the distance, undesirable radiation of zero harmonic is deleted and desirable radiating the minus first harmonic is remained. In arrays with serial feeding it is known effect of resonance reflection that is present when array period is multiple of half of wave length in a waveguide. On the other hand, radiating the minus first harmonic by a waveguide with sufficiently long periods is possible. Therefore, the distance between slots should be selected from the following equation:

$$0 < \frac{\pi}{P_w} - \gamma_w < \gamma_{pw}$$

Fields excited by different slots generate 2D wave beam that propagates in plane XOY. Angle between the direction of beam propagation and axis Ox (vertical waveguide is excited) is defined as follows:

$$\varphi_i = \arcsin\left(\frac{\frac{\pi}{P_w} - \gamma_w}{\gamma_{pw}}\right) - \varphi \quad (3)$$

where φ—angle between the waveguide and axis Oy.

Distribution of field in the direction orthogonal to direction of beam propagation is mainly determined by parameters of a slot array. For example, if all slots in the array has the same size, the amplitude propagation has exponential character. It is possible to vary amplitude propagation and make it closer to uniform by making slots of different sizes. Field distribution along direction of beam propagation has character of the running wave.

Going along of the array elements, the beam excites them and generates radiation into free space. It can be seen that in general the wave beam is propagated under some angle to the mesh lines in the nodes of which the array radiators are situated (FIG. 2). It is possible to describe radiation of the plane waveguide into free space in terms of space harmonics. Operational mode for this antenna is radiating the minus first harmonic. There are limitations for such antenna that are similar to limitations for waveguide array:

$$\frac{\pi}{\gamma_{pw}} < P_{pw} < \frac{2\pi}{\gamma_{pw}}$$

Figure 4:
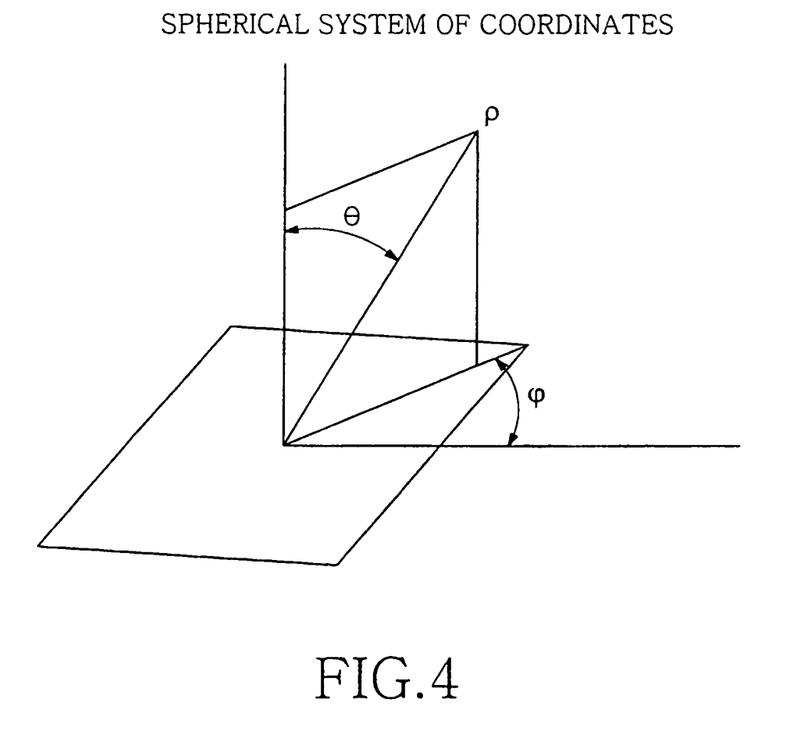
FIG. 4 illustrates spherical coordinate system.

It is convenient to represent radiation characteristics in spherical coordinate system, as shown in FIG. 4. Angle θ—is angle of elevation, and angle (φ—is azimuth angle. Radiation direction from the array coinciding with maximum of the antenna pattern is specified by angles $\theta_m$ and $\phi_m$. For proper antenna operation the angle $\phi_m$ should be close to 45 degrees. In this case, the azimuth angles of radiation while exciting at both inputs are close to each other due to antenna symmetry. Due to the same symmetry, the elevation angles of maximum radiation of both channels are coinciding.

Closeness of $\phi_m$ to 45 degrees is provided by the specific selection of waveguide parameters, slot array and radiating array based on a plane waveguide.

Approximately, size α of a wide side of a waveguide and period of the radiating array $P_{pw}$ can be obtained from the following formulas:

$$a = \frac{\pi}{\sqrt{k^2 - v^2}} \quad (4)$$

$$P_{pw} = \frac{2\pi}{\left(\frac{\pi}{P_w} - \gamma_w\right)\frac{\cos(\varphi) + \sin(\varphi)}{\cos(\alpha) - \sin(\alpha)} + \sqrt{\varepsilon \cdot k^2 - \left(\frac{\pi}{P_w} - \gamma_w\right)^2} \frac{\cos(\varphi) - \sin(\varphi)}{\cos(\alpha) - \sin(\alpha)}},$$

$$v = -\frac{B}{A} + \sqrt{\left(\frac{B}{A}\right)^2 - \frac{C}{A}}, \quad A = (\varepsilon - 1)^2 + \mu^2,$$

$$B = \frac{\pi}{P_w}((\varepsilon - 1)^2 - \mu^2),$$

$$C = \left(\frac{\pi}{P_w}\right)^2 - \mu^2\left(\varepsilon \cdot k^2 - \left(\frac{\pi}{P_w}\right)^2\right), \mu = \frac{1 + tg(\varphi)}{1 - tg(\varphi)}$$

At the same time, radiation of both channels in one direction in certain frequency range is provided.

At the same time, the angle $\theta_m$ depends on frequency. However, due to the fact that it is equal for both channels, this dependence does not lead to divergence of beams in space.

A very important antenna characteristic is radiation polarization. Normal operational mode of the claimed device is wave radiation mode with orthogonal polarization while exiting the antenna at its different inputs. Since the radiating element is a hole in metal screen, the determining factor is distribution of electric field and magnetic currents corresponding to it in the hole. Field generation in the radiating element is explained by FIG. 5. If the hole has square form then, at relatively small dimensions, it has properties which are close to properties of scalar radiator. Characteristic feature of such radiator is the fact that polarization of its radiation is fully determined by the angle of incidence of the exciting wave.

Figure 5:
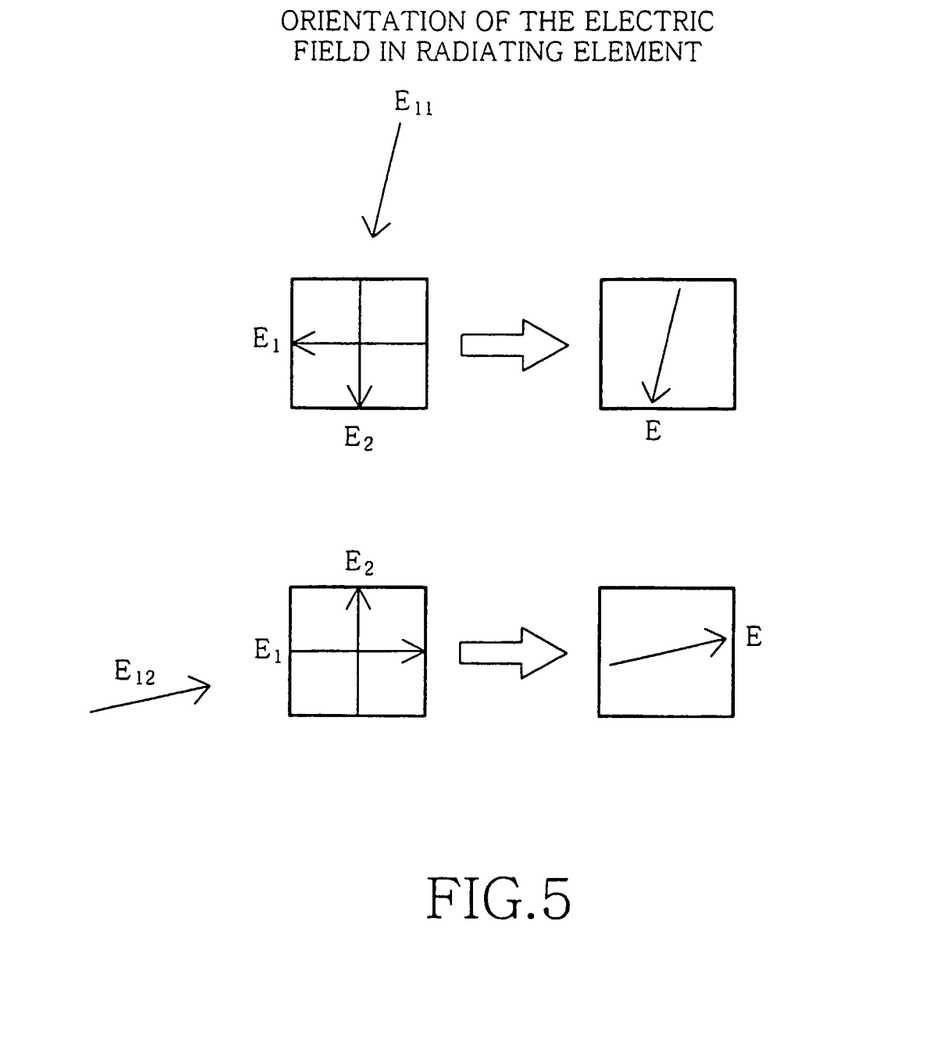
FIG. 5 illustrates a radiating element.

FIG. 5 illustrates two cases of exciting holes by waves $E_{i1}$ and $E_{i2}$. Arrows indicates directions of their propagation. They correspond to directions of propagation of the wave beams excited by waveguides 1 and 2 of the claimed antenna. Field in the hole can be represented as vector sum of two modes $E_1$ and $E_2$, which are fully identical to each other except orientation of vectors of electric field that are orthogonal to each other. Full field in the hole is vector sum of fields of two modes:

$$E = \alpha_1 E_1 + \alpha_2 E_2$$

where $\alpha_{1,2}$—excitement coefficients of modes. Excitement coefficients are proportional to scalar products of a vector of electric current of exciting wave (it is oriented along the direction of wave propagation) and vectors $E_1$ and $E_2$. It is not difficult to become sure that in this case, the sum vector of electric field in the hole is oriented along the direction of propagation of incident wave of the plane waveguide.

As shown in FIG. 5, due to the fact that propagation directions of beams excited by different waveguides are not orthogonal, vectors in the holes are not orthogonal. However, it is not followed that waves of free space also are not orthogonally polarized. The fact is that antenna radiates under certain angle to its plane, and in this case in order to generate orthogonally polarized waves in free space it is necessary to have non-orthogonally oriented radiators on the plane. The results below demonstrate that radiating is close to orthogonal in this structure of wave polarization.

There are limitations for parameters selection in the claimed antenna. One of them relates to condition of single-wave propagation of a plane waveguide wave in 2D array. In spite of the fact that the plane waveguide itself is one-mode waveguide, periodicity of the structure can lead to appearance of propagating waves of the highest type. Conditions for absence of such waves is the following:

$$\left(\frac{2\pi}{P_{pw}} + \beta_1\right)\frac{1}{\gamma_{pw}} > 1, \quad (5)$$

$$\beta_1 = \beta_0 \cos(2\alpha) - k_0 \sin(2\alpha), \beta_0 = \gamma_{pw}\sin(\varphi_i),$$

$$k_0 = \gamma_{pw}\cos(\varphi_i)$$

Figure 2B:
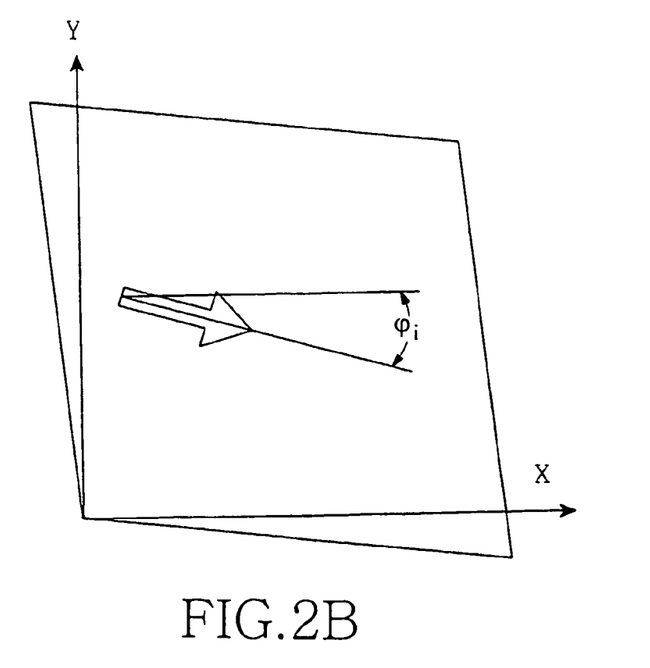

Angle $\varphi_i$ is shown in FIG. 2b. Note that meeting of (5) together with (4) automatically provides absence of side diffraction maximums in the antenna pattern.

Implementation of the claimed antenna is preceded by the parameters selection on the basis on specific requirements. Band of operational frequency and antenna gain coefficient are specified. Then dielectric is selected on the basis of which the plane waveguide is made, kind of radiator, then the following should be selected: period of location of slots in metal waveguide; size of wide side of a waveguide; period of radiating array from condition (4) providing radiation in both channels in one direction; and in equations excluding resonance reflection from the arrays in the waveguide and in the plane waveguide using methods of solution of electro dynamical tasks and proper software, sizes of holes are selected which provide the required amplitude distribution in the plane waveguide.

Example of specific implementation of the reviewed antenna is considered below. Geometric and electric parameters are specified below.

Size of wide side of waveguide is a=14.3
Size of narrow side of waveguide is b=8
Period of locations of slots in the waveguide is Pv=11
Width of a slot in the waveguide is $W_v$=1
Length of a slot in the waveguide is $L_v$=6.9
Shifting of slots in the waveguide relatively to the center of the wide side is $x_0$=2
Thickness of the plane waveguide is h=5.5
Dielectric permittivity of the plane waveguide is $\in$=2.2
Array period in the plane waveguide is $P_{pw}$=11.7
Dimensions of sides of square slot radiator is W=6.2
Inclination angle of the waveguide relatively the coordinate axis is $\phi$=6 degrees
Inclination angle of the lines of the array relatively the coordinate axis is $\alpha$=6 degrees.

All sizes are provided in millimeters. Diagrams below are obtained as a result of numerical simulation. This antenna has strictly periodical arrays of slots both in the waveguide and in the plane waveguide. That means that amplitude field distribution in the antenna aperture has exponentially decaying character both along lines parallel to waveguide and in orthogonal direction. Irregularity of amplitude distribution leads to dropping of aperture efficiency of antenna. The maximum value of aperture efficiency losses at exponential distribution for both coordinates is 2 dB. It is achievable at certain optimal value of exponent factor that is known in the theory of aperture antennas. Since exponent factors (coefficients of wave attenuation in the waveguide and in the plane waveguide) depend on frequency, the maximum aperture efficiency is achieved at certain fixed frequency. In frequency band this condition is not fulfilled, which results in additional decrease of aperture efficiency. Namely this factor together with in equation (5) limits operational frequency band of antenna. In this example it is equal to 10%. Due to this fact all calculations were performed in this frequency band.

Figure 6:
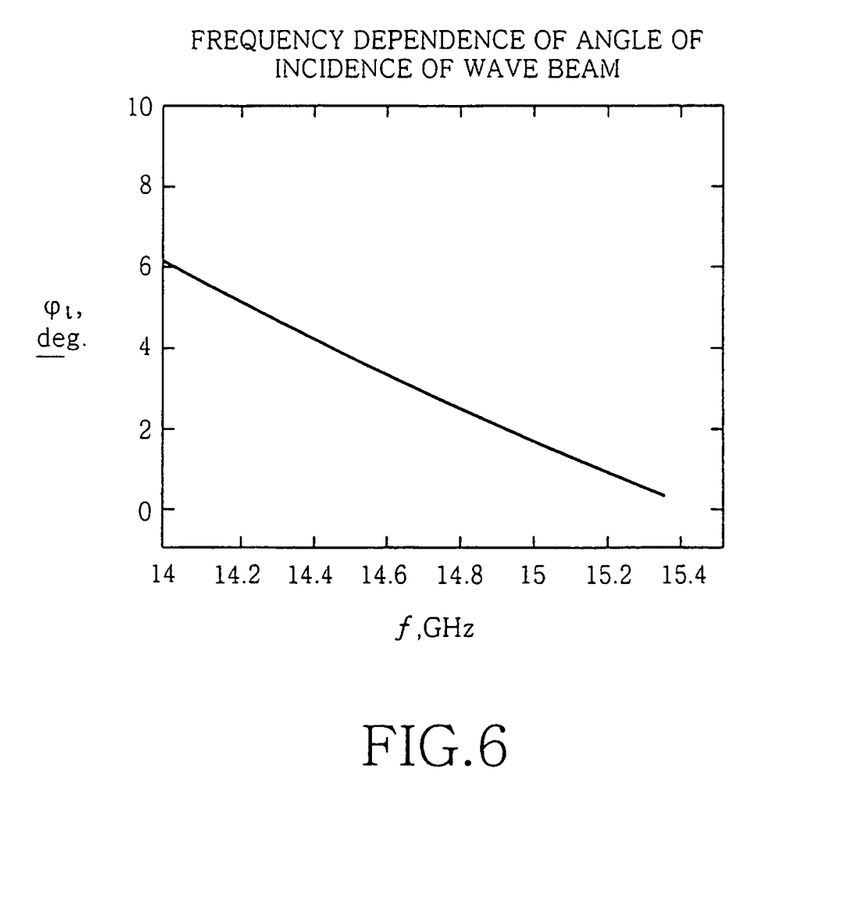
FIG. 6 illustrates a frequency dependence of angle of incidence of a wave beam.

FIG. 6 illustrates frequency dependence of angle of incidence of wave beam.

On the fixed frequency it is possible to select outline of plane waveguide in such way that a beam propagates along its borders. At the same time, the outline has a form of a rhomb and aperture efficiency is maximum. At frequency variation the angle of wave beam is changing which results in reducing antenna efficiency, since during deviation of a beam the antenna area is not fully used. However, in operational frequency band this effect is appeared weakly due to the fact that angle of incidence varies not more than for 6 degrees.

Figure 7:
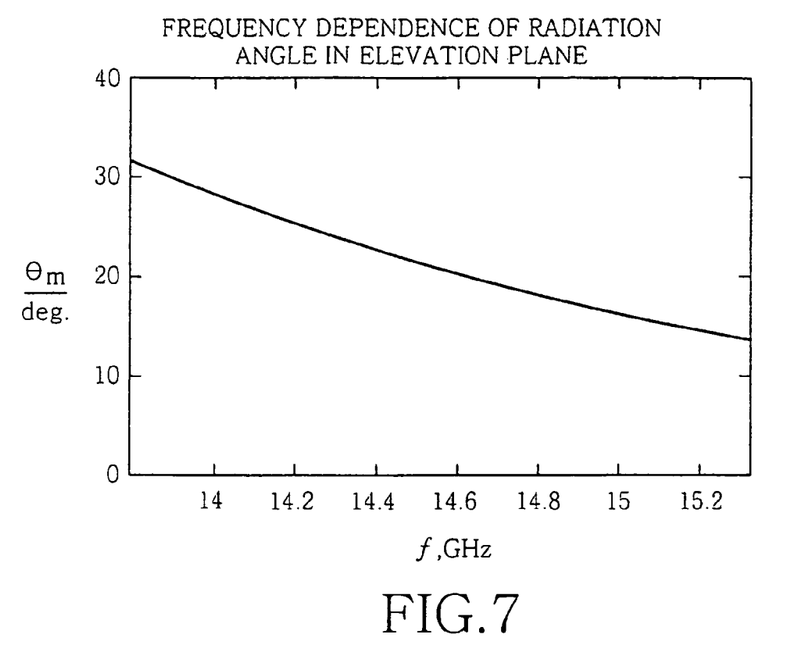
FIG. 7 illustrates a frequency dependence of angle of incidence in an elevation plane.
Figure 8:
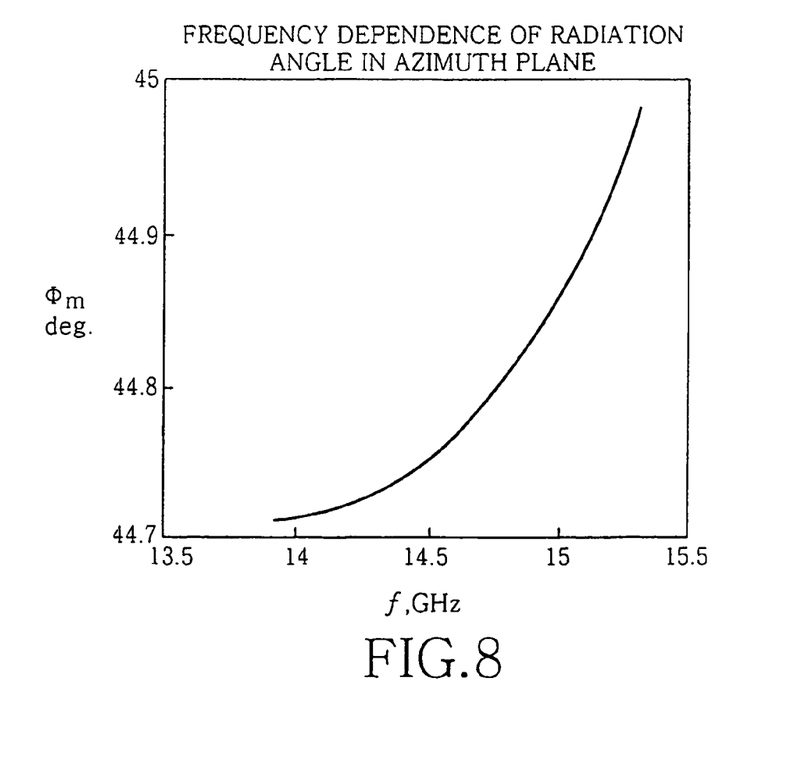
FIG. 8 illustrates a frequency dependence of angle of incidence in an azimuthal plane.

FIG. 7,8 illustrates frequency dependence of radiation angles in elevation and azimuth planes.

Figure 9:
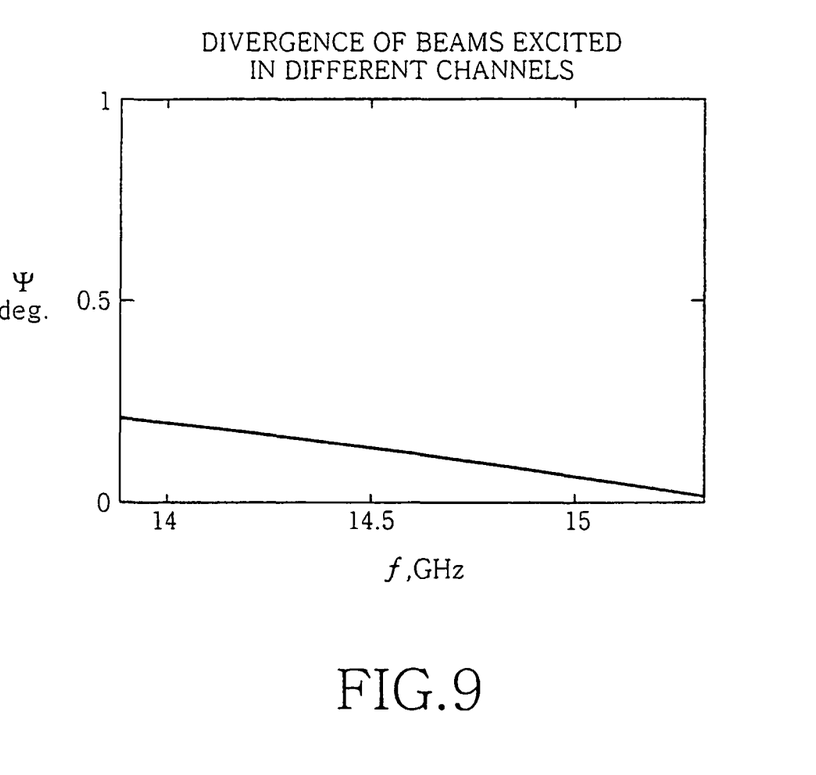
FIG. 9 illustrates a frequency dependence of angle between maximums of a patterns for different channels.

FIG. 9 illustrates dependence between maximums of patterns for various channels depending on frequency.

Figure 10:
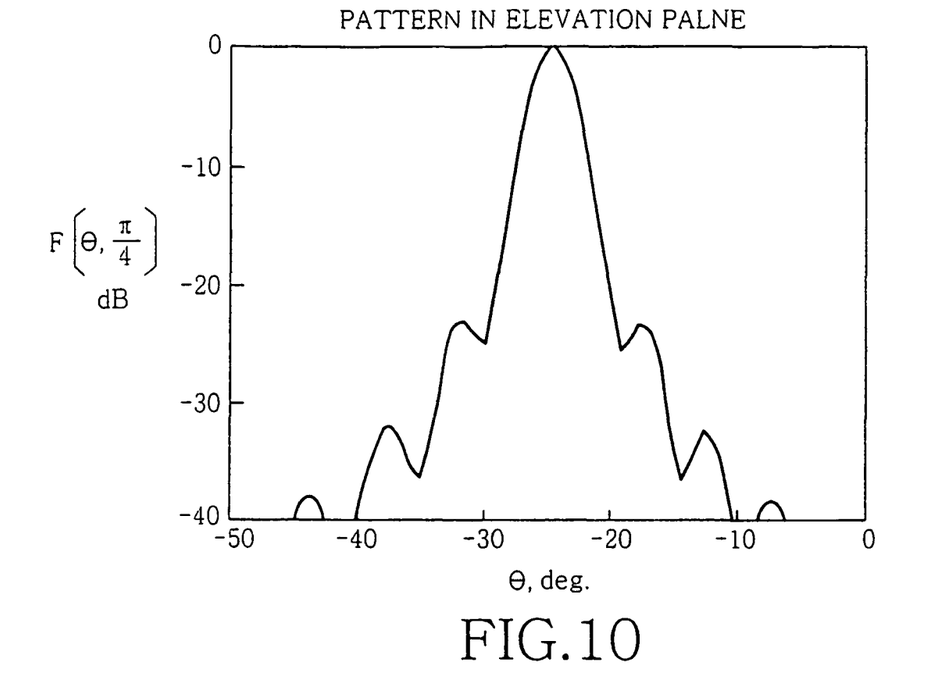
FIG. 10 illustrates a normalized pattern in an elevation plane at exponential distribution in an aperture.
Figure 11:
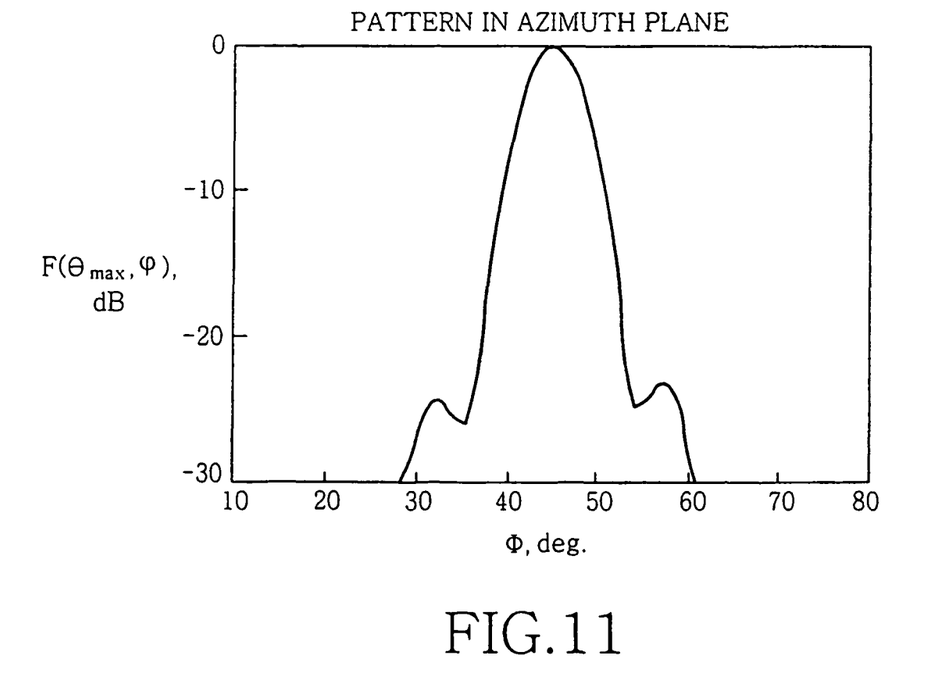
FIG. 11 illustrates a normalized pattern in an azimuthal plane at exponential distribution in an aperture.

FIG. 10, 11 illustrates normalized antenna patterns in two orthogonal planes: elevation and azimuth at exponential distribution in aperture. Low level of side lobes in both planes should be mentioned.

Figure 12:
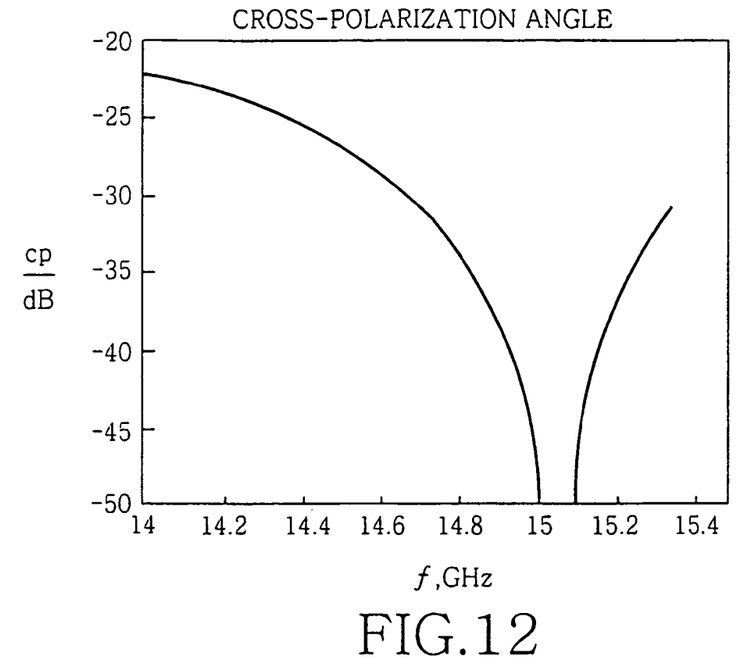
FIG. 12 illustrates a frequency dependence of cross-polarization level.

FIG. 12 illustrates frequency dependence of cross-polarization level, which dependence is determined by angle between vectors of electric field in the far field while exciting antenna from different inputs.

Figure 13:
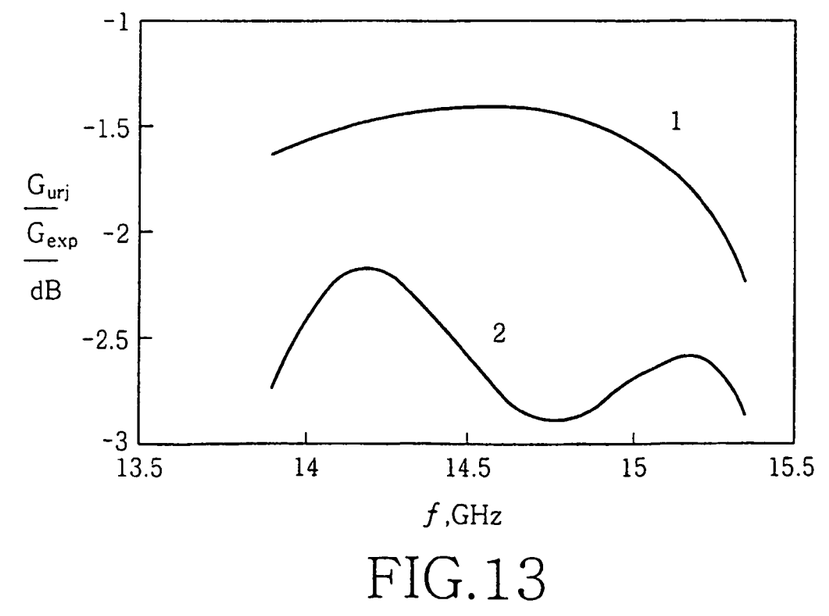
FIG. 13 illustrates a frequency dependences of aperture efficiency for two different distributions on an antenna aperture.

FIG. 13 illustrates frequency characteristics of dependence of aperture efficiency for two different distribution in antenna aperture. Curve 2 corresponds to exponential distribution along two coordinates. Curve 1 corresponds to uniform distribution in the waveguide and to exponential one in orthogonal direction.

The obtained results indicate that the claimed antenna allows to provide wide range of operational frequencies (about 10%). At the same time, slots in the waveguide can be made using traditional technology (mechanical processing) and radiators in the plane waveguide—by means of manufacturing printed circuits (photolithography with further etching) if radiators are slot- or strip-formed and also by pressing of dielectric radiators.

What is claimed is:

1. A planar antenna comprising:
a planar metal-plated, at least on one side, dielectric waveguide, to side walls of which two metal waveguides are adjoining that are connected with the planar waveguide via a periodical array of slots, wherein an array period of the periodical array of slots comprises two slots shifted or inclined with respect to each other, and radiating elements having two symmetry planes are placed in nodes of a rhombic mesh on a surface of the planar waveguide,
wherein the two metal waveguides are not orthogonal to each other, and each of the two symmetry planes is not parallel to either of the two metal waveguides.

2. The device of claim 1, in which the planar waveguide has a form of a rhomb.

3. The device of claim 1, in which the two metal waveguides have rectangular cross-section.

4. The device of claim 3, in which the two metal waveguides are in contact with wide sides of the planar waveguide.

5. The device of claim 3, in which the two metal waveguides are in contact with narrow sides of the planar waveguide.

6. The device of claim 1, in which the planar waveguide is metal-plated on two sides and the radiating elements are implemented as metallizations having a square or round form.

7. The device of claim 1, in which the planar waveguide is metal-plated on one side, and the radiating elements are implemented as metallizations having a square or round form.

* * * * *